United States Patent [19]
Gregory

[11] Patent Number: 4,858,073
[45] Date of Patent: Aug. 15, 1989

[54] METAL SUBSTRATED PRINTED CIRCUIT

[75] Inventor: Vernon C. Gregory, Escondido, Calif.

[73] Assignee: Akzo America Inc., New York, N.Y.

[21] Appl. No.: 170,546

[22] Filed: Mar. 21, 1988

Related U.S. Application Data

[63] Continuation-in-part of Ser. No. 940,523, Dec. 10, 1986, abandoned.

[51] Int. Cl.$^4$ .............................................. H05K 7/20
[52] U.S. Cl. ...................................... 361/388; 357/81; 361/398; 361/414; 174/68.5
[58] Field of Search ............... 361/386, 387, 388, 398, 361/400, 403, 410, 411, 414; 174/68.5, 16 HS; 357/80, 81; 29/830, 831, 832, 846, 848, 849; 165/185

[56] References Cited

U.S. PATENT DOCUMENTS

| | | | |
|---|---|---|---|
| 4,450,471 | 5/1984 | Wellhoefer et al. | 357/80 |
| 4,459,607 | 7/1984 | Reid | 357/71 |
| 4,510,519 | 4/1985 | Dubois et al. | 357/81 |
| 4,510,551 | 4/1985 | Brainard, II | 361/398 |
| 4,556,899 | 12/1985 | Kurihara et al. | 357/80 |
| 4,584,767 | 4/1986 | Gregory | 29/848 |
| 4,630,172 | 12/1986 | Stenerson et al. | 361/386 |
| 4,635,092 | 1/1987 | Yerman et al. | 357/68 |
| 4,658,332 | 4/1987 | Baker et al. | 361/398 |
| 4,677,252 | 6/1987 | Takahashi et al. | 174/68.5 |

Primary Examiner—Gerald P. Tolin
Attorney, Agent, or Firm—Louis A. Morris

[57] ABSTRACT

A semiconductor fabrication having thermal characteristics comparable to hybrid ceramic packages comprises a flexible copper foil printed circuit on a thin polyimide film layer thermally laminated to a metal surface, such as aluminum, with a high temperature thermal plastic, such as polyetherimide. A semiconductor die is attached to a relatively thick metal heat spreader which in turn is attached to at least a portion of the copper foil. The resultant structure is a semiconductor package which has a thermal performance comparable to that of typical hybrid ceramic packages.

44 Claims, 5 Drawing Sheets

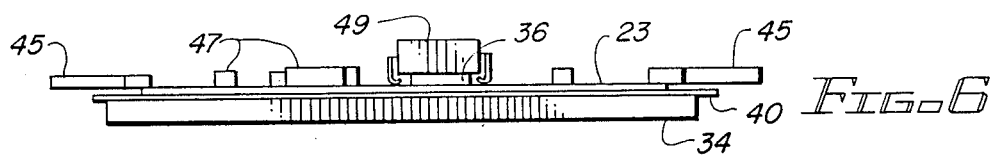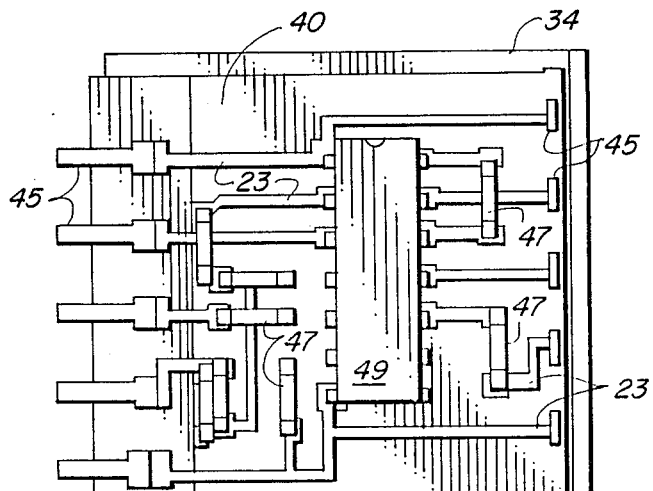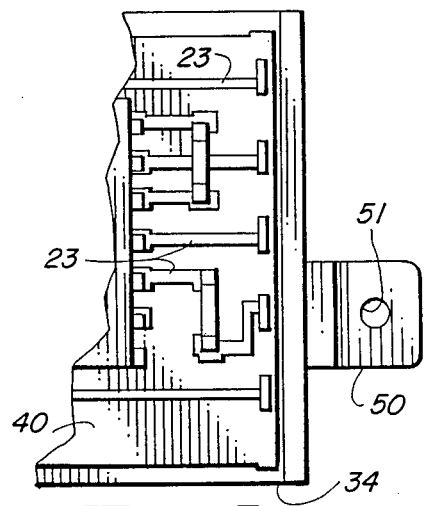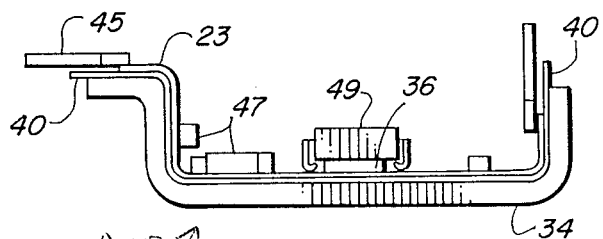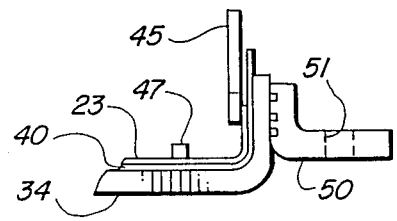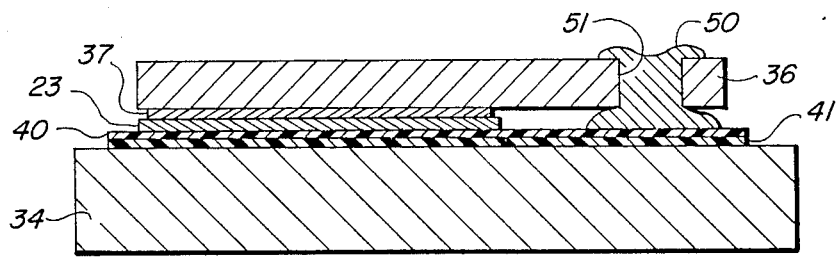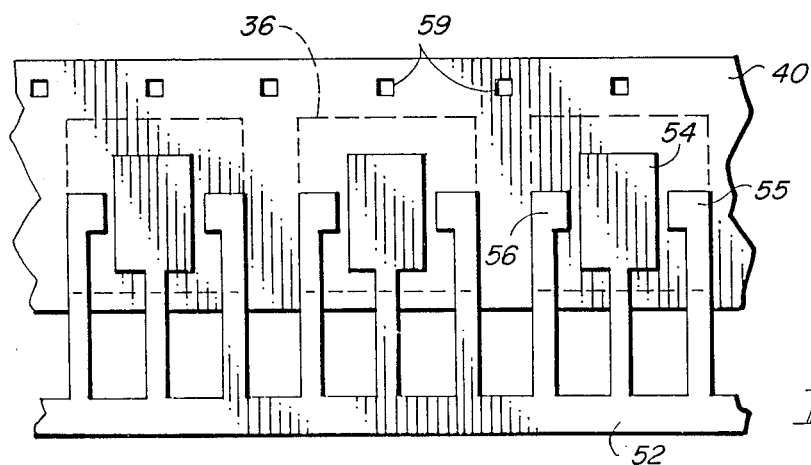

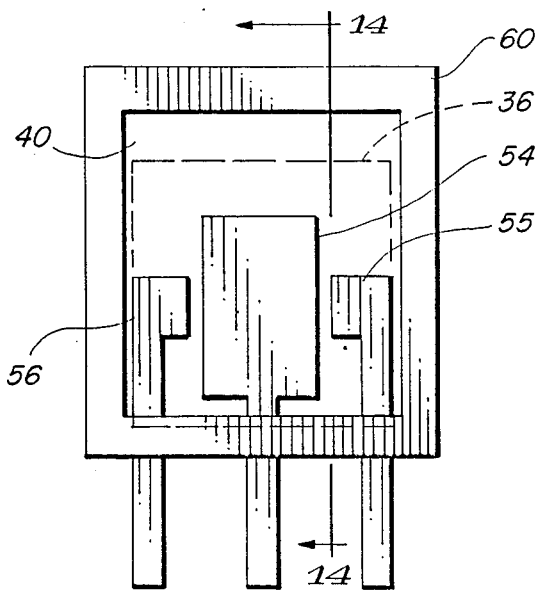
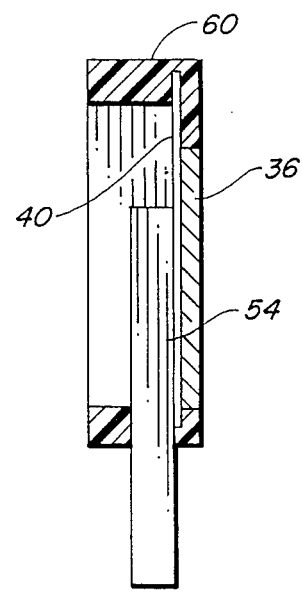
FIG.13  FIG.14
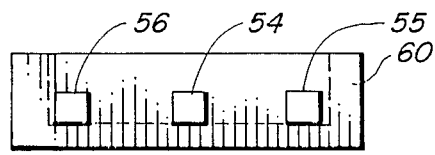
FIG.15
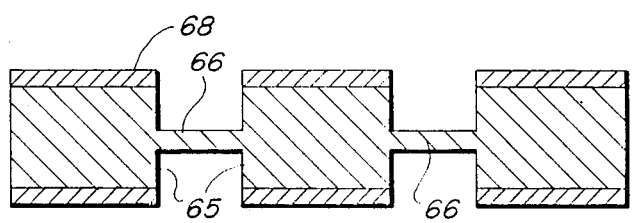
FIG.16
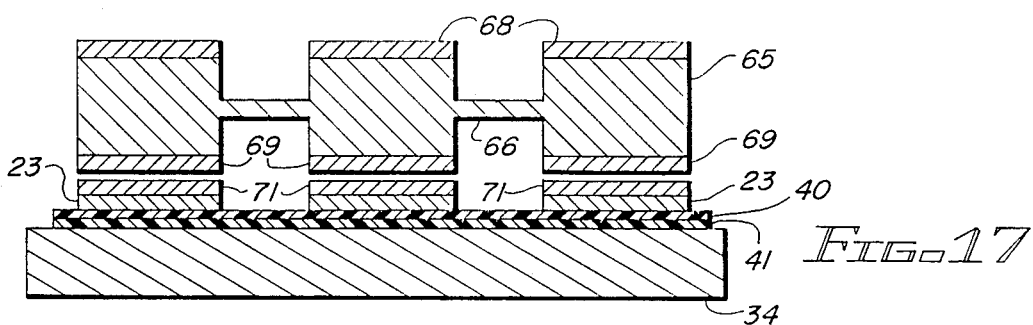
FIG.17
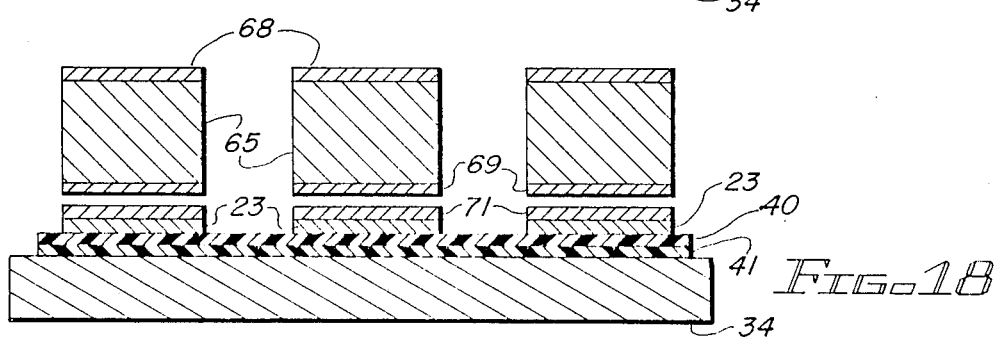
FIG.18

METAL SUBSTRATED PRINTED CIRCUIT

RELATED APPLICATION

This application is a continuation-in-part of application Ser. No. 940,523, filed on Dec. 10, 1986, now abandoned.

BACKGROUND OF THE INVENTION

Printed circuit boards for providing circuit interconnections between various electrical components, such as integrated-circuit packages, resistors, capacitors, and the like are in widespread use. Conventional printed circuit boards generally comprise a flat insulating laminate made of phenolic or a similar material, which has a conductive pattern formed on one or both surfaces. The conductive pattern generally is etched from a layer of copper foil which is adhesively secured to the surface of the laminate board. Production of the pattern is effected by first printing a photoresist image of the desired pattern on the foil and the etching away the exposed portions of the foil not covered by the photoresist. Such boards also are machine drilled or punched to provide openings through the boards to provide mounting holes and openings for passage of conductors from one side of the board to the other (in the case of double sided boards). Once the circuit boards have been completed, the electronic components are attached to the board, and the board then is housed in the particular apparatus with which it is used.

Applications have been developed for molded circuit boards in which a thermoplastic material forming a housing (such as a telephone handset of the like) has a copper foil adhesively secured to the molded housing or body, and a conductive pattern is produced in the manner similar to that employed in the manufacture of conventional printed circuit boards. By adhering the foil for a conductive pattern directly to the housing, the necessity for a separate phenolic printed circuit board enclosed within the housing is eliminated.

An improvement in molded printed circuit boards is disclosed in U.S. Pat. No. 4,584,767 to Vernon C. Gregory. This improvement comprises the formation of a conductive pattern on a flexible plastic film or web which then is placed in a mold prior to formation of a molded housing to cause the web to be securely and integrally bonded to the material used to form the molded housing.

Another approach to providing printed circuit boards in non-planar or multi-planar configurations is disclosed in the Patent to Takahashi U.S. Pat. No. 4,677,252. The circuit board structure of this patent comprises a rigid metal substrate made of aluminum, copper or other suitable material. A first resin layer is bonded to the metal substrate by means of a second resin layer. The two layers are made of different material, with the first layer having a relatively limited elongation. The bonding layer is made of a resin material with an elongation of greater than 100%, and each of the resin layers has a thickness of between twenty (20) to three hundred (300) microns. The total combined thickness of the two layers is less than five hundred (500) microns but at least forty (40) microns a conductive metal layer made of metal foil then is sputtered or plated onto the top of the first layer, with a suitable circuit being etched or otherwise formed in this conductive metal layer.

The circuit board of Takahashi, with the various layers bonded to it, then may be bent into various configurations. The second resinous layer provides stretching between the circuit board and the conductive metal layer without resulting disconnection in the metal layer or the substrate. Because of the substantial thickness of the two resin layers (greater than forty (40) microns), good electrical insulation exists between the conductive metal foil layer and the underlying metal substrate. In addition, however, the resin layers of Takahashi provide considerable thermal insulation as well between the metal substrate and the copper foil circuitry formed on top of the upper resin layer. Thermal transfer through the relatively thick resin layers is poor. The structure of this patent is concerned with bending and is not directed to operation as a thermal heat sink.

Printed circuits made in conjunction with any of the above described techniques are suitable for signal processing semiconductor components rated for operating environments of less than 80° C., for example. For power handling semiconductors, significantly higher operating temperatures are encountered; and it generally is necessary to provide cooling for such semiconductors to prevent their temperatures for rising to the failure point of the devices.

Early semiconductor packages for power semiconductors were designed by electrically connecting the semiconductor die to a metallic housing for the semiconductors. With the die directly attached to the metal of the housing, the package itself served as a thermal conduction path for heat to flow to a lower temperature point, cooling the semiconductor die. In many applications, however, a semiconductor die cannot be mounted in this way on the metallic structure of the package since electrical isolation is required. In such applications, it has been a common practice to mount the semiconductor die on ceramic substrates to achieve the necessary electrical isolation. The most widely used ceramic for circuit substrates is alumina (aluminum oxide), since this ceramic has a very high thermal conductivity for an insulating material. Although other ceramics exhibit greater thermal conductivity, they are not frequently used because of higher costs or handling difficulties. Plastic films (such as used in the Takahashi Patent) have much lower thermal conductivities than ceramics; and, as a consequence, have not been used as circuit substrates for applications where any substantial amount of thermal conductivity is required.

The mounting of semiconductor components on ceramic substrates for improved thermal characteristics results in structures which generally are referred to as "hybrid" structures. Where ceramics such as alumina are employed, the resultant structure is relatively thick. In addition, hybrid ceramic semiconductor structures are comparatively expensive and require specialized manufacturing processes.

It is desirable to provide structures having the thermal characteristics of hybrid ceramic structures without the disadvantages of such hybrid structures. Further it is desirable to utilize flexible circuit materials employing polyimide films in place of alumina ceramic hybrid structures.

SUMMARY OF THE INVENTION

It is an object of this invention to provide an improved electronic structure.

It is another object of this invention to provide an improved electronic structure employing polymer clad substrates for printed circuit patterns in structures having improved thermal performance.

It is another object of this invention to employ a foil lamination on a thin flexible plastic layer bonded to a metal substrate to form a metal printed circuit board.

It is a further of this invention to provide an inexpensive printed circuit board having improved temperature dissipation characteristics.

It it yet an additional object of this invention to employ metal heat spreaders with a lamination of flexible plastic film and copper foil to produce structures having improved thermal dissipation characteristics.

In accordance with the preferred embodiment of the invention, an electronic structure includes a metal substrate to which is bonded an insulation layer of plastic film having a thickness of less than 20 microns. Conductive foil is bonded on the other side of the plastic film in a desired conductive pattern. For some structures, a conductor plate which is considerably thicker than the conductive foil is attached to at least a portion of the foil pattern, and a semiconductor device is mounted in heat exchanging proximity to the conductor plate to dissipate heat produced in the semiconductor.

In another embodiment of the invention, the configuration for the package for a power handling semiconductor comprises conductive metal plates on one side of a flexible plastic film, having a thickness of less than 20 microns, with lead frames for a power semiconductor bonded to the other side.

BRIEF DESCRIPTION OF THE DRAWINGS

FIG. 6 is an end view of the structure shown in FIG. 5;

FIG. 7 is a top view of a variation of the structure shown in FIG. 5;

FIG. 8 is an end view of the device shown in FIG. 7;

FIGS. 9 and 10 are top and end views, respectively, of an addition to the embodiment shown in FIGS. 7 and 8;

FIG. 11 illustrates additional features of a preferred embodiment of the invention;

FIG. 12 shows another embodiment of the invention;

FIG. 13 is a top view of an individual structure formed from the continuous web structure shown FIG. 12;

FIGS. 14 and 15 are a cross-sectional side and an end view, respectively, of the structure shown in FIG. 10;

FIGS. 16, 17, and 18 illustrate details of steps in the manufacturing process used in accordance with fabrication of a preferred embodiment of the invention;

DETAILED DESCRIPTION

Figure 1:
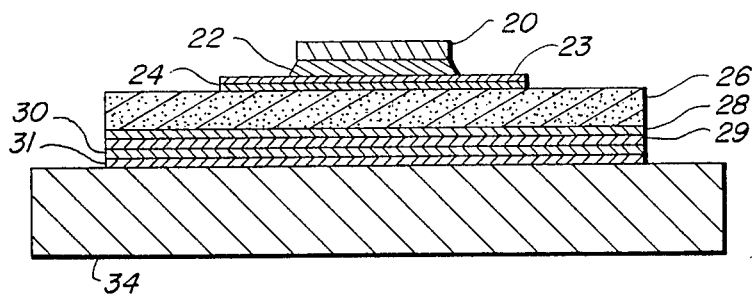
FIG. 1 is a cross-sectional view of a prior art hybrid ceramic structure.

Reference now should be made to the drawing in which the same reference numbers are used throughout the different figures to designate the same of similar components. For a better understanding of the significant features of the invention, a bried description of conventional hybrid semiconductor structures is considered in order.

Such a structure is shown in cross-sectional representation in FIG. 1. A typical hybrid integrated circuit for use with power or high temperature semiconductors is a multi-layer structure. The silicon die 20 for the semiconductor of such a prior art structure to be protected is mounted on a copper circuit trace 23 with solder 22. The circuit trace 23 is attached to an alumina ceramic substrate 26 by means of a vitreous interface material 24. The other side of the alumina substrate 26 is attached to a metalized surface 29 with another layer of vitreous interface material 28. This constitutes the primary structure which then is bonded to a metal case or heat sink 34, typically made of aluminum. The bond is formed by a solder layer 30 which adheres to a solderable surface 31 prepared on the surface of the heat sink 34. As is readily apparent from an examination of FIG. 1, many manufacturing steps are required; and the alumina substrate is relatively thick, since ceramic cannot be made in cross-sectional thicknesses much less than 0.020 inches due to the fragility and brittleness of the materials.

Figure 2:
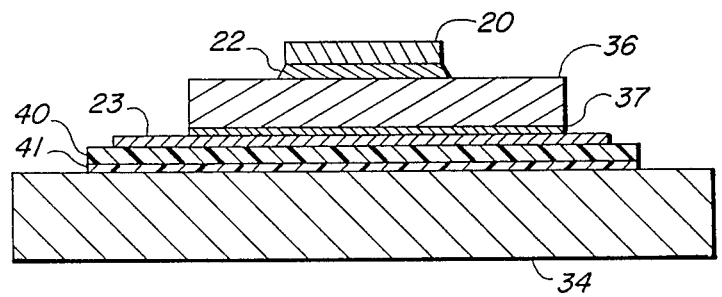
FIG. 2 is a cross-sectional view of a preferred embodiment of the invention.

Reference now should be made to FIG. 2, which is a cross-sectional view of a preferred embodiment of the invention. The embodiment of FIG. 2 exhibits thermal characteristics comparable to the hybrid ceramic structure of FIG. 1. The embodiment of FIG. 2, however, is significantly simpler in structure and is capable of utilization in configurations which are impossible or extremely difficult with the prior art embodiment illustrated in FIG. 1. The embodiment of FIG. 2 employs a flexible printed circuit of the type incorporated into the structure of the above mentioned U.S. Pat. No. 4,584,767. A preferred material for such a flexible circuit is a polymer clad substrate (PCS) of the type manufactured by Enka America, Inc. Typically, flexible printed circuit substrates are made from metalized plastic film. When the flexible plastic substrate does not need to be soldered, plastic substrate film generally is a low-cost polyester such as film manufactured by DuPont under the trademark "Mylar". Frequently, however, flexible circuits must be capable of withstanding exposure to high temperature soldering processes; and in such cases, the substrate film used is a Polyimide (PI). A well known commercial example of such a film is manufactured by DuPont under the trademark "Kapton".

In the manufacture of flexible circuits using Kapton polyimide films, a thin copper foil is bonded to the plastic film by a thin adhesive layer. The existence of the adhesive layer, however, thickens the product and reduces the flexibility of the finished product. The PCS flexible material manufactured by Enka has no adhesive layer. This is the type of structure which is utilized in the embodiment shown in FIG. 2.

The metal case or heat sink 34 is the same as illustrated and described above in conjunction with FIG. 1. The upper surface of the metal heat sink 34 (as viewed in FIG. 2) initially is prepared, following normal cleaning or degreasing, by a mild etching to roughen the otherwise smooth metal surface to prepare it for thermoplastic bonding with high temperature thermoplastic materials, such as polyetherimide (PEI) of the type manufactured by General Electric as "Ultem". A similar material is marketed by Enka as "Fusible PCS". Other bonding materials which appear suitable are polysulphone, polyethersulphone, etc., which have nearly identical properties and costs to polyetherimide.

After etching, the upper surface of the metal heat sink 34 (as viewed in FIG. 2) has a thin film of PEI deposited on it. Typically this ia accomplished by solvent casting the desired film onto the upper surface of the heat sink 34. The PEI is dissolved in a suitable solvent such as Methanol Chloride. This solution then is sprayed onto the surface of the heat sink 34, and the evaporation of the solvent leaves the desired plastic coating 41 securely adhered to the previously prepared surface of the heat sink 34. A PCS substrate consisting of a thin layer of copper foil 23 bonded to a Polyimide film layer 40, which is coated on its lower side with a very thin layer of high temperature PEI thermoplastic then is thermally bonded to the upper surface of the heat sink 34.

In FIG. 2, the relative thicknesses of the various layers are illustrated, but the layers 23, 40 and 41 are significantly exaggerated in thickness in order more clearly to show these layers in FIG. 2. A typical PCS printed circuit material is Enka PCS-50-50-F. The numbers indicate that the copper foil layer 23 is one-half ounce per square foot in weight (0.0007 inches thick) and the Polyimide film 40 is one-half mil thick (0.0005 inches). For good thermal transfer characteristics, the film 40 typically is between three and ten microns thick. The "F" indicates the existence of the thin, fusible thermoplastic back-coating 41. The layer 41 may be as thin as 1 micron (0.000040 inches thick) and as thick as ten microns. The plastic film layers 40 and 41 (with a combined thickness of twenty microns or less) provide complete electrical insulation between the metal heat sink 34 and the copper foil layer 23. At the same time, however, excellent thermal transfer takes place across the film layers.

Printed circuit patterns are produced in the foil layer 23 by any of the well known techniques for producing such patterns. Typically this includes printing the pattern with a photoresist material, followed by the step of etching away the unexposed portions of the copper foil layer 23, with a final cleaning of the photoresist material from the pattern which remains after the etching step. Other techniques may be used as well. The particular technique used to produce the desired printed circuit pattern in the foil layer 23 is not significant to the invention disclosed here, and any presently used commercial techniques which are compatible with PCS materials may be employed.

Polymeric materials exhibit significantly less thermal conductivity than alumina ceramics, such as the ceramic layer 26 of FIG. 1. To obtain thermal performance characteristics which are comparable to hybrid circuits using alumina ceramics, a metal heat spreader plate 36 is soldered to appropriate portions of the printed circuit copper foil 23 by means of a high temperature solder layer 37. This metal spreader plate 36 typically is in the form of a relatively thick (on the order of 0.020 inches) rectangular copper plate 36 which covers an area approximately ten times that of a semiconductor die 20 soldered to the upper surface of the plate 36 by means of a high temperature solder layer 22. For applications where lead frames are not used, the plate 36 may be formed by selective electroplating onto the desired areas on the foil 23. This may be accomplished by known plating processes.

Even though the copper heat spreader 36 is of a thickness which is substantially greater than the thickness of the copper foil layer 23, the thickness of the layer 36 is significantly less than that typically employed for alumina ceramics, such as the layer 26 shown in FIG. 1. In addition, the copper heat spreader plate 36 is not brittle and fragile; so that the structure of FIG. 2 may be used in configurations which are not possible with the conventional ceramic hybrid structure of FIG. 1. In comparative tests, it has been found that the thermal conductivity of the composite structure of FIG. 2 is comparable to or better than the thermal conductivity of standard hybrid circuits of the type shown in FIG. 1.

Figure 3:
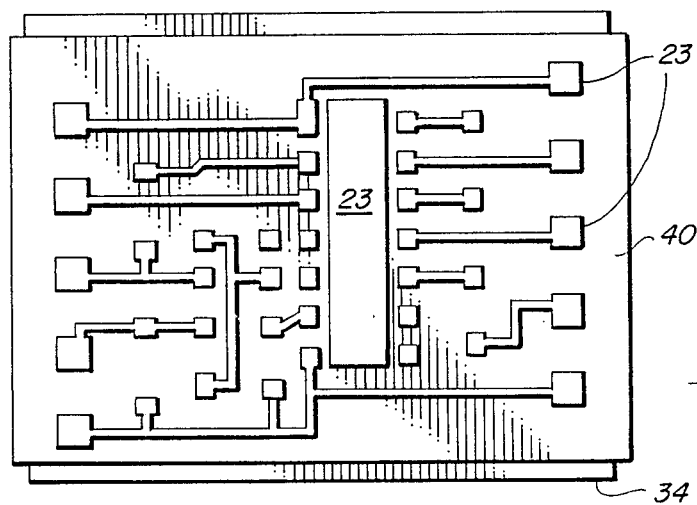
FIG. 3 is a top view of a portion of the structure of a preferred embodiment of the invention.

FIG. 3 is a top view of a portion of the structure shown in FIG. 2, illustrating the "metal circuit board" which may be configured on an aluminum substrate 34. In FIG. 3, a single plane of circuitry is illustrated, similar to a single-sided printed circuit board. The circuitry employs the circuit trace or pattern 23 of the foil layer which remains after the etching step to which reference has been made above. For a single-sided printed circuit board, these traces do not cross one another. The structure shown in FIG. 3 is a low-cost product of conventional dimensions. In addition to the low-cost obtained from the use of the PCS material, the structure has the advantage of significant mechanical strength because it primarily comprises the relatively thick metal plate 34. Although the plate 34 has been described as aluminum, it may be made of any desirable metal, alloy, or combinations of metals.

Figure 4:
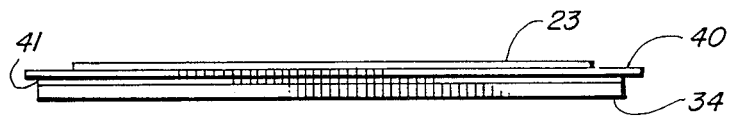
FIG. 4 is an end view of the structure shown in FIG. 3.

FIG. 4 is an edge view of the structure of FIG. 3, showing the relative orientations of the copper foil circuit traces 23, the PI layer 40, and the PEI backing layer 41 bonded to the upper surface of the metal plate 34.

Figure 5:
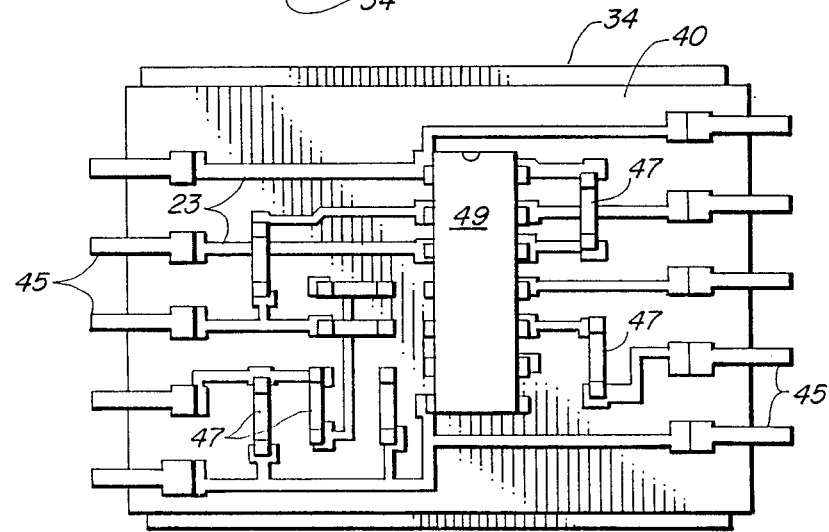
FIG. 5 is a top view of the embodiment of FIG. 3 showing the addition of further components to the structure.

FIG. 5 is a top view of the structure of FIG. 3, and FIG. 6 is an end view of the structure of FIG. 5 with the various mounted circuit components attached. These components comprise connectors 45, resistors and capacitors 47, and integrated circuit components 49. For the integrated circuit components 49, heat spreader plates 36 of the type shown in FIG. 2 may be bonded to the copper foil area 23 which underlies the integrated circuit components 49 to provide the heat transfer from the components 49 into the plates 36, in the manner described previously in conjunction with FIG.2. It should be noted that heat which is transferred into the metal spreader plate 36 then dissipates readily from the spreader 36 through the relatively thin PI and PRI layers 40 and 41 (having a combined thickness of twenty microns or less) into the metal heat sink 34.

The end view of FIG. 6 most clearly shows the relative locations of the various portions of the structure. In FIG. 6, the solder layers 22 and 37 along with the PEI layer 41 have not been shown for the sake of clarity. It should be noted, however, that these layers are present in the structure of FIG. 6 in the form illustrated in the enlarged detailed cross-sectional view of FIG. 2.

FIGS. 7 and 8 are a top view and an end view, respectively, of a circuit configuration identical to the one shown in FIGS. 3 through 6, but in which the aluminum substrate 34 is bent upwardly at both ends and then outwardly at the left end (shown in FIGS. 7 and 8) parallel with the main body to form a structure having a non-planar configuration. In all other respects, the structure of FIGS. 7 and 8 is identical to the one of FIGS. 3 through 6; but this structure illustrates the variety of configurations which may be employed in a final structure as a result of the use of the flexible fusible PCS material as an integral part of the overall structure.

FIGS. 9 and 10 are top and end views, respectively, of a portion of the right-hand end of the embodiment shown in FIGS. 7 and 8 to which has been attached a weldment 50 having a hole 51 through it. The weldment 50 is attached to the aluminum plate 34 prior to the time the rest of the circuitry, including the PCS layers, is laminated to the plate 34. The weldment 50 indicates that many other parts or benefaction processes may be included, and that the structures are not restricted to simple metal plates.

As is apparent from an examination of FIGS. 7 through 10, the circuitry including the metal heat spreader plates 36, may be placed on either planar or developed shapes of metal plates 34 without the need for additional, conventional phenolic printed circuit boards. As a consequence, new opportunities are provided for product designers. In addition, the overall costs of materials and labor is substantially reduced.

FIG. 11 is a cross-sectional representation of various methods of attaching the heat spreader plates 36 to the copper foil conductor layer 23. As illustrated in FIG. 11, this may be done either by use of a thin, reflow solder layer 37, of the type described previously in conjunction with FIG. 2; or a suitable conductive or non-conductive adhesive 50 may be poured through spaced openings 51 to bond the heavy copper spreader 36 to the PI layer 40 of the flexible PCS material. Other conventional attachment means also may be used to hold the metal spreaders 36 in place. Such attachment means include spot welding and riveting. The particular attachment employed is whichever is best suited for the manufacturing process and the final use of the structure intended by the designer.

As mentioned previously, the purpose for adding the relatively heavy copper heat spreader plate 36 is to increase the area of the polymeric insulator through which heat is transferred to reduce the thermal impedance. Typically, a copper heat spreader 36 having a thickness of 0.020 inches and covering an area of approximately 10 times that of a semiconductor die to be cooled, results in cooling equal to that which has been obtained by mounting a comparable die on a metalized alumina ceramic 26 of the type shown in FIG. 1. Thus, the mass per unit area of the plate 36 is considerably greater than the mass per unit area of the foil layer 23.

FIG. 12 illustrates an application of the principles of the invention to another embodiment particularly useful in the manufacture of power transistors, thyristors, and the like. Product designers frequently would like to be able to add components to a flexible circuit, such as a PCS circuit. In the past, however, this has been difficult because of mechanical stresses on unsupported components or inadequate cooling for the component resulted. These problems both are surmounted by utilization of the structure shown in FIG. 12. In this structure, an elongated continuous strip or web of Polyimide (PI) film 40 having indexing holes 59 along one edge is used in conjunction with conventional machinery for fabricating power transistors or the like. The upper and lower surfaces of the PI film 40 are coated with a thin, fusible thermoplastic PEI layer of the type described previously in conjunction with FIG. 2. The combined thickness of the film 40 and PEI layer is between six and twenty microns.

A suitably configured lead frame 52 having three basic lead or connector areas 54, 55 and 56, of the type commonly used for three-terminal power devices has the lower surfaces etched and treated in the manner described previously in conjunction with the embodiment of FIG. 2. This lead frame is thermally bonded to the upper surface of the PI film 40. Similarly, heat spreaders 36 (typically made of copper), comparable to the heat spreaders described previously, are treated and bonded to the lower surface of the film 40, underlying the area beneath the connectors 54, 55, and 56 of each component to be made from the strip illustrated in FIG. 12.

The continuous web of material which is illustrated in FIG. 12 then is indexed through suitable molding tools to form premolded packages 60 suitable for the mounting of a power semiconductor die. Such individual packages are shown in FIGS. 13, 14 and 15 which are respectively the top, cut-away side view, and end view of a premolded package. The package material preferably is a polyethimide resin such as General Electric Ultem resin. The characteristics of such a resin and the manner in which it is molded in conjunction with plastic printed circuit boards is described in detail in U.S. Pat. No. 4,584,767, so that further discussion is not considered necessary here. The heat spreader insert plate 36 serves the same purpose for thermal conductivity as is accomplished in the embodiments described above in conjunction with FIGS. 2 through 10. In addition, however, in the structure of FIGS. 13, 14, and 15, the rectangular copper heat spreader 36 provides additional mechanical strength; so that the thin PI film 40 may be employed as the carrier for the structure, when the PI layer 40 alone lacks sufficient mechanical strength to permit it to be used for fabricating a power semiconductor package.

In many applications, heat removal is required from a number of different areas of a printed circuit and generally these different areas must remain electrically isolated from one another. Consequently, several heat spreader plates 36 may be required instead of the single heat spreader of the different embodiments which have been described above. Individual attachment of each of these different heat spreaders 36 is uneconomical. Consequently, the thick copper spreaders 36 may be constructed in a manner similar to the construction of circuit patterns of the type described above formed in the copper foil layer 23.

Construction of such multiple spaced-apart heat spreaders is illustrated in FIGS. 16 through 18. Individual heat spreaders 65, which are comparable to the heat spreader plate 36 described previously, are formed in the desired pattern on a sheet of metal by printing pattern using high temperature solder 68 and 69 on both sides of the sheet as an etchant resist. Other types of resist, such as photo-resist, could be used, but the high temperature solder resist is particularly suitable for the structure of devices of the type described above in conjunction with the embodiments of FIGS. 1 through 10. In the cross-sectional view of FIG. 16, the various heat spreaders 65 are "gang-attached" to correspond to comparable areas of the printed circuit copper foil 23 on the polyimide layer 40 of the PCS material. This is illustrated in FIG. 18.

Referring again to FIG. 16, however, after the resist has been applied, the sheet is partially etched from both sides to remove most the exposed copper, but leaving a thin web 66 of copper attached to hold the desired heavy copper areas 65 in the proper relationship to one another. Reflow solder then is used to attach this partially etched sheet to the mating pattern on the foil 23 on the PCS layer area. This is accomplished by fusing the high temperature solder areas 69 and 71 together in the orientation shown in FIGS. 17 and 18. Following this attachment, a final etching, using suitable etching materials, is employed to remove the thin web 66 from between the thick copper areas 65. This leaves the wanted product as illustrated in FIG. 17 ready for attachment of the semiconductor die and integrated circuits in the manner described previously.

In addition to employing a final etch to remove the webs 66, other methods may be used to isolate the different metal areas 65, after bonding to the copper foil patterns 23, as illustrated in FIGS. 17 and 18. One technique which may be utilized is to burn away the thin metal webs 66 by the passage of electric current between the various areas. In this method, the thin webs 66 may be considered to be fuse linkages, since the current applied is sufficient to vaporize these linkages while leaving unaffected the thick areas 65. The evaporated metal of the fuse linkages 66 will not form conductive paths on the surface of the film 40 since any paths which would be formed are in turn, heated and removed by the continued flow of current through the structure. Isolated metal spots left on the film 40 may make this means of removal of the webs 66 undesirable for high voltage products. This process, however, is attractive for high volume, low voltage products, such as control modules for automobiles.

Figure 19:
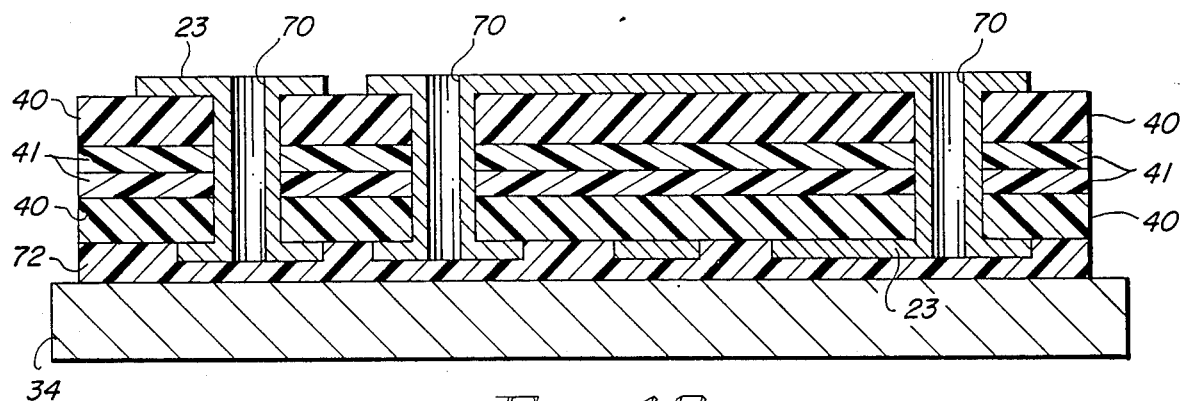
FIG. 19 is a cross-sectional view of a double-sided circuit employing the principles of a preferred embodiment of the invention.

Many circuit substrates require more than one plane of circuitry, with interconnections between the planes to form all of the connections required by the circuitry. FIG. 19 is a cross-sectional view of a two-sided flexible circuit made from two sheets of PCS material laminated together by thermally laminating the two PEI surfaces together. The same reference numbers are used in FIG. 19 as are employed in the structure of FIG. 2 for those components which are identical to the ones of FIG. 2. The circuit patterns in the copper foil layers 23 are etched in accordance with conventional techniques. Through-hole plating to form connectors 70 from the circuit patterns 23 on the upper PCS sheet with the circuit patterns 23 on the lower PCS sheet then is effected utilizing commercial equipment and practices. Various heat spreaders 36 or 65 are added as desired in accordance with the embodiments previously described.

Bonding of this two-sided flexible circuit to a metal plate or heat spreader 34, however, must be accomplished in a modified form from the technique described in conjunction with FIG. 2. The lower PCS layer cannot be attached directly, since the exposed copper conductors 23 on this layer now face the upper surface of the base plate or heat sink 34. If direct bonding were to be accomplished, this would cause a short circuit of the lower circuit patterns 23. Consequently, an additional thin (0.0005 inches) PEI film 72 is used between the metal plate 34 and the circuit trace surface 23 of the lower PCS film to provide a thermal laminating adhesive and electrical insulation between the metal plate 34 and the conductor traces 23 of the lower flexible circuit. Minimal heat and pressure are used to prevent exposed copper from reaching the metal plate through the film layer 72. With thicker copper in some PCS materials, thicker PEI film layers 72 are used to ensure no contact is made between the lower-most conductor traces 23 shown in FIG. 19 and the metal base plate 34.

Figure 20:
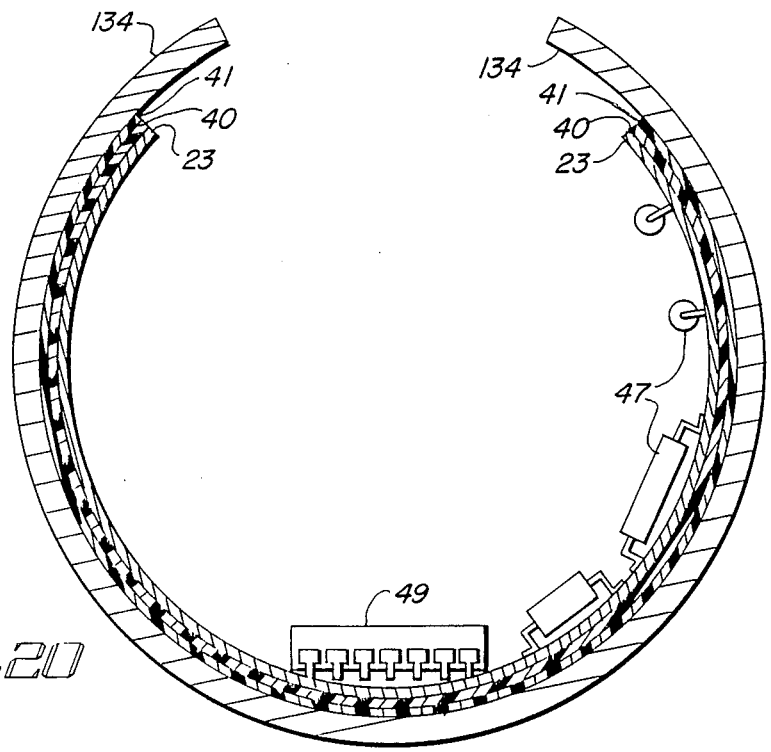
FIGS. 20 and 21 illustrate different configurations of a preferred embodiment of the invention.
Figure 21:
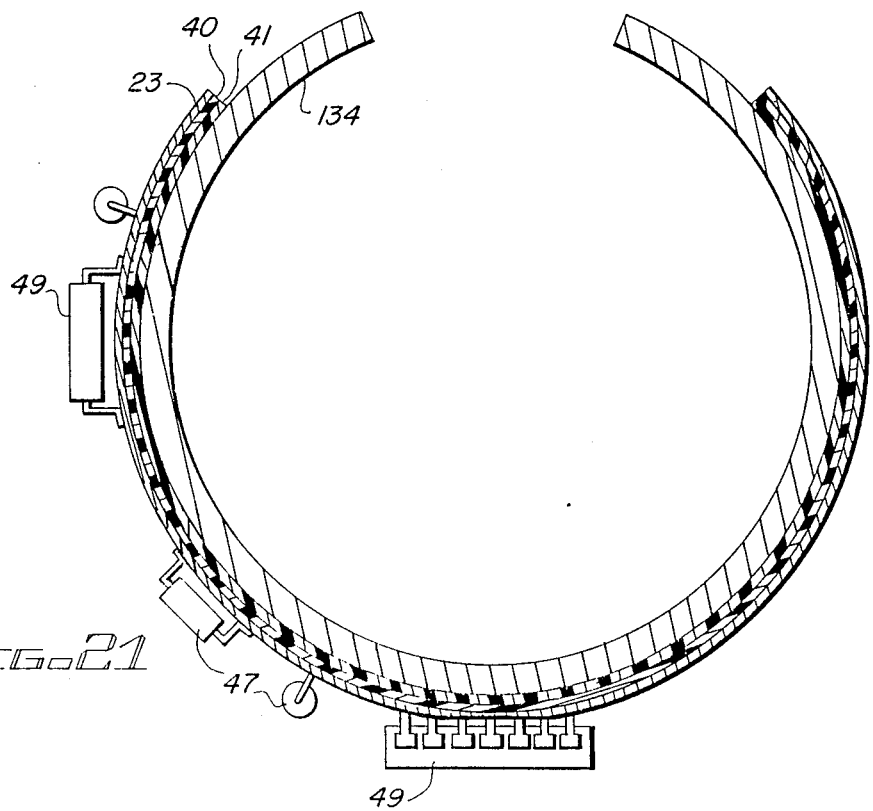

FIGS. 20 and 21 illustrate additional configurations which are possible utilizing the principles of this invention. As described previously, the PCS materials and the remainder of the structures are bonded to flat surfaces of metal base plates, such as base plate 34. The printed circuits, however, also may be bonded to metal base plates or heat sinks in the form of springs which are not necessarily flat in final configuration. Such configurations are shown in FIGS. 20, 21, and 22.

Reference first should be made to FIGS. 20 and 21. These figures illustrate cross-sectional views of the bonding of flexible PCS circuits to flat springs which are set into a final shape after they are punched and bent. Once the springs, shown as circular springs 134 in FIGS. 20 and 21, are bent into shape, they are heat treated to set the metal to a desired amount of spring. Such springs typically may be made of beryllium copper, phosphor bronze, or other materials exhibiting the desired characteristics. Springs of this type provide ease of mounting of the circuitry in various housings and also facilitate in the transfer of heat from electrical components through the springs and into the parts in which the springs are mounted. When a spring circuit is used as an insert in a molding press, the spring 134 aids in locating and maintaining location of the subassembly within the mounting tool.

As illustrated in FIGS. 20 and 21, circuit configurations of the type described previously in conjunction with FIGS. 5 through 10 may be bonded to either the internal (FIG. 20) or the external (FIG. 21) surface of the spring 134. Overmolding of the structures shown in FIGS. 20 and 21 may be used to protect all of the components and to stiffen the final products, so that the flexure from the spring 134 is not transferred as mechanical stress to the components, such as the components 47 and 49, used in the completed product. A common use of the technique illustrated in FIGS. 20 and 21 is in simple circuits, such as temperature sensors and the like.

Figure 22:
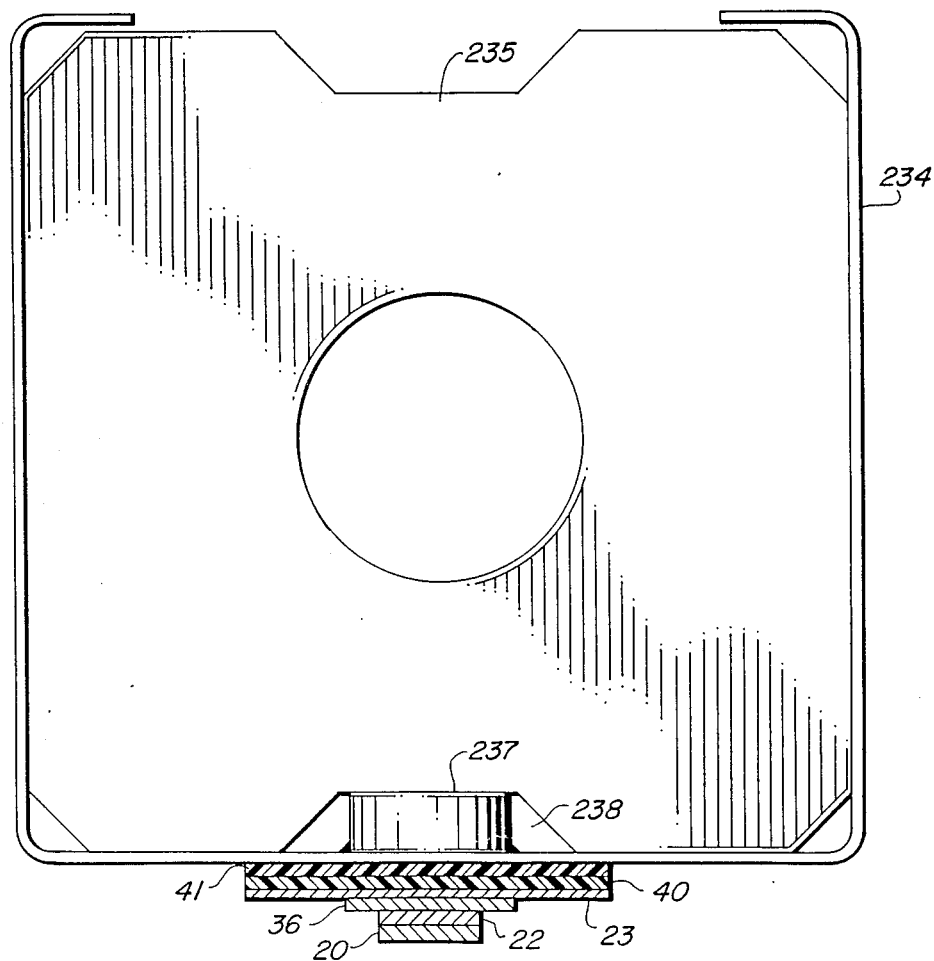
FIG. 22 illustrates another embodiment of the invention.

FIG. 22 illustrates a flat metal spring 234 configured in a square or rectangular shape. In the structure shown in FIG. 22, the spring is attached over one end of a motor field winding lamination 235. A temperature sensor semiconductor 20 is mounted on the bottom of the spring shown in FIG. 22 and is provided on a layered assembly of the type illustrated in FIG. 2. On the inside of the spring 234, opposite the heat spreading plate 36, an additional thermal mass heat sink 237 is provided. The heat sink 237 comprises a copper container filled with glycole or water. This container 237 is sealed and is soldered to the inside of the spring 235 by means of solder 238. The added mass of the container 237, and the fluid contained within it, increases the thermal time constants of the circuitry attached to the other side of the spring 234. This added mass does not change the final temperatures, but increases the time required to reach the final conditions of operation. This added mass is provided to slow the rate of heating of a semiconductor device, such as a triac, to permit it to survive for longer periods of time without cooling than would be the case if the thermal mass of the container 237 were not provided.

It is apparent from the foregoing description, that the combined thickness of the film layer 40 and the adhesive layer 41 in all of the various embodiments is made as thin as possible while still maintaining a given dielectric strength. Typically, for applications in the automotive industry, the combined thickness of the two layers is somewhere around 6 or 7 microns. For power applications, the combined thickness is of the order of 15 to 20 microns. The use of the plastic film layer 40 and a second or separate adhesive layer 41 also provides additional protection for power circuits in the event of pinhole defects in one or the other of the layers. Such defects rarely, if ever, exactly coincide; so that the desired electrical insulation characteristics are maintained. As mentioned above, it is important to make the combined thickness of the film and adhesive layer as thin as possible to obtain useful thermal heat transfer across this thickness from the semiconductors and other components, which are mounted on the metal foil side of the structure, to the underlying metal substrate heat sink. It has been found that sufficient electrical insulation is obtained with good heat transfer when the combined thickness of the insulating layers is in the range mentioned above.

The embodiments which have been described above and which are shown in the various figures of the drawings are to be considered as illustrative and not as limiting of the invention. Various changes and modifications will occur to those skilled in the art without departing from the scope of the invention. Particularly, the circuit configurations which are shown are merely representative of configurations which may be employed; and a wide variety of circuit configurations, components, and the like may be employed. Also, the various dimensions and relative dimensions which are given for many of the components may be changed by those skilled in the art without departing from the scope of the invention as defined by the appended claims.

I claim:

1. An electronic metal printed circuit board structure including in combination:
   a metal substrate;
   an electrical insulation layer of plastic film having first and second sides;
   conductive foil means bonded to the first side of said plastic film, said conductive foil means having a first predetermined thickness;
   a heat dissipating conductor plate having a thickness greater than said first predetermined thickness attached to at least a portion of said conductive foil means;
   semiconductor means mounted in heat exchanging proximity to said conductor plate;
   bonding means selected from the group consisting of polyetherimide, polysulphone and polyethersulphone bonding the second side of said plastic film to said metal substrate, the combined thickness of said plastic film and said bonding means being less than twenty microns, and substantially less than the thickness of said conductor plate and said metal substrate, to permit heat dissipation into said metal substrate from said foil means and said conductor plate while providing electrical insulation between said substrate and said conductive foil means.

2. The combination according to claim 1 wherein said plastic film is polyimide plastic film.

3. The combination according to claim 2 wherein said means bonding said second side of said insulation layer to said metal substrate comprises a fusible thermoplastic.

4. The combination according to claim 3 wherein said fusible thermoplastic is polyetherimide.

5. The combination according to claim 4 wherein said metal substrate comprises a heat sink.

6. The combination according to claim 5 wherein said metal substrate is an aluminum heat sink.

7. The combination according to claim 6 wherein the thickness of said conductor plate is several times greater than the thickness of said conductive foil means.

8. The combination according to claim 7 wherein said semiconductor means comprises a silicon die.

9. The combination according to claim 8 wherein said silicon die is mounted on said conductor plate.

10. The combination according to claim 9 wherein said silicon die is soldered to said conductor plate, and said conductor plate is soldered to said conductive foil.

11. The combination according to claim 9 wherein said semiconductor means is attached in thermal heat exchanging relationship to said conductor plate.

12. The combination according to claim 1 wherein the surface of said metal substrate is non-planar and said plastic film and said conductive foil means are flexible and are contoured to said surface of said metal substrate.

13. The combination according to claim 12 wherein said conductive foil means and said conductor plate both are copper.

14. The combination according to claim 13 wherein said plastic film is polyimide plastic film.

15. The combination according to claim 14 wherein said means bonding said second side of said plastic film to said metal substrate comprises a fusible thermoplastic.

16. The combination according to claim 15 wherein said means bonding said second side of said plastic film to said metal substrate comprises a layer of thermoplastic film.

17. The combination according to claim 14 wherein the thickness of said conductor plate is several times greater than the thickness of said conductive foil means.

18. The combination according to claim 17 wherein said semiconductor means comprises a silicon die.

19. The combination according to claim 18 wherein said silicon die is mounted on said conductor plate.

20. The combination according to claim 1 wherein said metal substrate is a flat metal spring.

21. The combination according to claim 20 wherein said spring is made of beryllium-copper.

22. The combination according to claim 14 wherein said semiconductor means is attached in thermal heat exchanging relationship to said conductor plate.

23. The combination according to claim 22 wherein said silicon die is soldered to said conductor plate, and said conductor plate is soldered to said conductive foil.

24. The combination according to claim 23 wherein said plastic film is polyimide plastic film.

25. The combination according to claim 24 wherein said means bonding the second side of said plastic film to said metal substrate comprises a layer of thermoplastic film.

26. The combination according to claim 1 wherein the mass per unit area of said conductor plate is several times greater than the mass per unit area of said conductive foil means.

27. The combination according to claim 1 wherein said semiconductor means comprises a silicon die.

28. The combination according to claim 1 wherein said means bonding said second side of said plastic film to said metal substrate comprises a fusible thermoplastic.

29. The combination according to claim 28 wherein said fusible thermoplastic is polyetherimide.

30. The combination according to claim 29 wherein said plastic film is polyimide plastic film.

31. An electronic metal printed circuit board structure including in combination:
- a metal substrate board;
- a polyimide film having first and second sides;
- a flexible, conductive foil printed circuit bonded to said first side of said polyimide film;
- bonding means selected from the group consisting of polyetherimide, polysulphone and polyethersulphone bonding the second side of said polyimide film to the surface of said metal substrate board, the thickness of said polyimide film and said bonding means being less than twenty microns to permit substantial heat dissipation into said metal substrate board from said conductive foil printed circuit while providing electrical insulation between said foil printed circuit and said board.

32. The combination according to claim 31 wherein said bonding means comprises a thermoplastic layer; wherein said thermoplastic layer thermally bonds said polyimide film to said surface of said metal substrate and the combined thickness of said film and said thermoplastic layer is less than twenty microns.

33. The combination according to claim 32 wherein said conductive foil is copper foil.

34. The combination according to claim 33 further including a metal heat dissipating plate electrically insulated from said metal surface and bonded to at least a portion of one of said flexible conductive foil printed circuit and said polyimide film.

35. The combination according to claim 34 wherein said metal plate is copper.

36. The combination according to claim 35 wherein said metal plate has a mass per unit of area substantially greater than the mass per unit area of said conductive foil.

37. The combination according to claim 31 further including a metal heat dissipating plate electrically insulated from the surface of said metal substrate by said polyimide film and bonded to at least a portion of one of said flexible conductive foil printed circuit and said polyimide film.

38. The combination according to claim 37 wherein said metal substrate has a mass per unit of area substantially greater than the mass per unit area of said conductive foil.

39. An electronic metal printed circuit board structure including in combination:
- a carrier layer of electrically insulating plastic film having first and second sides;
- a heat dissipating metal plate providing the structural rigidity for said structure, said plate having a thickness substantially greater than the thickness of said plastic film;
- bonding means selected from the group consisting of polyetherimide, polysulphone and polyethersulphone bonding said first side of said plastic film to said heat dissipating metal plate, the combined thickness of said bonding means and said plastic film being less than twenty microns; and
- at least one electrical conductor bonded to said second side of said plastic film opposite said metal plate, the thickness of said plastic film and said bonding means permitting substantial heat transfer therethrough from said second side thereof to said metal plate.

40. The combination according to claim 39 further including semiconductor means mounted in electrical connection with said conductor.

41. The combination according to claim 40 wherein said semiconductor means is mounted in heat exchanging proximity through said plastic film to said metal plate.

42. The combination according to claim 41 further including encapsulation means encapsulating said plastic film, said metal plate, at least the portion of said conductor bonded to said plastic film, and said semiconductor means in a component housing.

43. The combination according to claim 40 wherein said semiconductor means is mounted in heat exchanging proximity through said plastic film to said metal plate.

44. The combination according to claim 39 further including encapsulation means for encapsulating said plastic film, said metal plate and, at least the portion of said conductor bonded to said plastic film, in a component housing.

* * * * *